US012697766B2

(12) United States Patent
Nishida

(10) Patent No.: US 12,697,766 B2
(45) Date of Patent: Aug. 4, 2026

(54) IMPRINT APPARATUS, IMPRINT METHOD, METHOD OF MANUFACTURING ARTICLE, DETERMINATION METHOD. AND NON-TRANSITORY COMPUTER-READABLE STORAGE MEDIUM

(71) Applicant: CANON KABUSHIKI KAISHA, Tokyo (JP)

(72) Inventor: Toshihiko Nishida, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 84 days.

(21) Appl. No.: 18/769,521

(22) Filed: Jul. 11, 2024

(65) Prior Publication Data

US 2024/0359394 A1      Oct. 31, 2024

Related U.S. Application Data

(63) Continuation of application No. 17/709,885, filed on Mar. 31, 2022, now Pat. No. 12,138,847.

(30) Foreign Application Priority Data

Apr. 8, 2021      (JP) ................................. 2021-066065

(51) Int. Cl.
*B29C 41/20*      (2006.01)
*B29C 31/04*      (2006.01)
(Continued)

(52) U.S. Cl.
CPC .......... *B29C 59/026* (2013.01); *B29C 31/048* (2013.01); *B29C 59/002* (2013.01); *B29L 2031/34* (2013.01); *G03F 7/0002* (2013.01)

(58) Field of Classification Search
CPC ....... B29C 41/20; B29C 41/36; G03F 7/0002; G03F 7/16; G03F 7/161
(Continued)

(56) References Cited

U.S. PATENT DOCUMENTS 10,120,276 B2      11/2018 Schumaker
11,635,684 B1 *     4/2023 Ghariehali ............ G03F 7/0002
101/450.1
(Continued)

FOREIGN PATENT DOCUMENTS

JP      2018195811 A      12/2018
JP      6700844 B2      5/2020
(Continued)

OTHER PUBLICATIONS

Notice of Allowance issued in U.S. Appl. No. 17/709,885 mailed Aug. 7, 2024.
(Continued)

*Primary Examiner* — Leo B Tentoni
(74) *Attorney, Agent, or Firm* — ROSSI, KIMMS & McDOWELL LLP

(57)      ABSTRACT

The present invention provides an imprint apparatus that forms a pattern of an imprint material on a substrate using a mold, the apparatus comprising: a supplier configured to supply the imprint material as a plurality of droplets onto the substrate; and a controller configured to control the supplier based on information indicating a target arrangement of the imprint material to be supplied as the plurality of droplets onto a predetermined region of the substrate, wherein the plurality of droplets in the target arrangement include a first droplet group including a plurality of first droplet arrays, a second droplet group including a plurality of second droplet arrays, and a third droplet array.

10 Claims, 6 Drawing Sheets

(51) Int. Cl.

| | | |
|---|---|---|
| *B29C 41/36* | (2006.01) | |
| *B29C 59/00* | (2006.01) | |
| *B29C 59/02* | (2006.01) | |
| *G03F 7/16* | (2006.01) | |
| *B29L 31/34* | (2006.01) | |
| *G03F 7/00* | (2006.01) | |

(58) Field of Classification Search
USPC ................................................. 264/259, 319
See application file for complete search history.

(56) References Cited

U.S. PATENT DOCUMENTS

| | | | |
|---|---|---|---|
| 2010/0193994 A1 | 8/2010 | Wuister et al. | |
| 2016/0288404 A1 | 10/2016 | Schumaker et al. | |
| 2018/0164678 A1 | 6/2018 | Fletcher et al. | |
| 2020/0096863 A1 | 3/2020 | Ozturk et al. | |

FOREIGN PATENT DOCUMENTS

| | | | |
|---|---|---|---|
| KR | 1020160117323 A | 10/2016 | |
| KR | 1020200124620 A | 11/2020 | |

OTHER PUBLICATIONS

Office Action issued in U.S. Appl. No. 17/709,885 mailed on Aug. 7, 2023.
Notice of Allowance issued in U.S. Appl. No. 17/709,885 mailed on Dec. 13, 2023.
Office Action issued in U.S. Appl. No. 17/709,885 mailed on Apr. 12, 2024.

\* cited by examiner

F I G. 3A

F I G. 3B

IMPRINT APPARATUS, IMPRINT METHOD, METHOD OF MANUFACTURING ARTICLE, DETERMINATION METHOD. AND NON-TRANSITORY COMPUTER-READABLE STORAGE MEDIUM

CROSS REFERENCE TO RELATED APPLICATIONS

This application is a continuation of and claims priority to U.S. patent application Ser. No. 17/709,885, filed Mar. 31, 2022, now issued as U.S. Pat. No. 12,138,847, which claims priority to Japanese Patent Application number 2021-066065, filed Apr. 8, 2021, the entire disclosures of each of which are incorporated herein in their entirety by reference.

BACKGROUND OF THE INVENTION

Field of the Invention

The present invention relates to an imprint apparatus, an imprint method, a method of manufacturing article, a determination method, and a non-transitory computer-readable storage medium.

Description of the Related Art

As one of lithography techniques for manufacturing a semiconductor device or the like, there is known an imprint technique of forming a pattern of an imprint material on a substrate using a mold. In the imprint technique, after the imprint material is supplied as the plurality of droplets onto a shot region of the substrate and the mold is brought into contact with the imprint material on the substrate, the imprint material is cured in this state, and the mold is separated from the cured imprint material. With the process (imprint process) as described above, a pattern formed of a cured product of the imprint material can be formed on the shot region of the substrate.

In the imprint technique, it is desired that the residual layer thickness of the pattern of the imprint material formed on the substrate using the mold is uniform. The residual layer thickness is the thickness of the imprint material between the substrate and the concave portion of a concave-convex pattern formed of the imprint material. Japanese Patent No. 6700844 describes a method in which, when the imprint process is performed using a mold including a plurality of portions having different pattern arrangements, the arrangement of the imprint material (droplets) in the boundary portion between the plurality of portions is determined so as to achieve the uniform residual layer thickness.

In the imprint technique, in addition to improvement of the uniformity of the residual layer thickness, reduction of extrusion (protrusion) of the imprint material from the shot region is desired. On example of the method of reducing extrusion of the imprint material is a method in which the number of droplets of the imprint material arranged in the outer peripheral portion of the shot region is decreased. However, with this method, the residual layer thickness in the outer peripheral portion becomes smaller than that in other portions, and this can be disadvantageous in terms of the uniformity of the residual layer thickness.

SUMMARY OF THE INVENTION

The present invention provides, for example, an imprint technique advantageous in achieving both of improvement of the uniformity of a residual layer thickness and reduction of extrusion of an imprint material.

According to one aspect of the present invention, there is provided an imprint apparatus that forms a pattern of an imprint material on a substrate using a mold, the apparatus comprising: a supplier configured to supply the imprint material as a plurality of droplets onto the substrate; and a controller configured to control the supplier based on information indicating a target arrangement of the imprint material to be supplied as the plurality of droplets onto a predetermined region of the substrate, wherein the plurality of droplets in the target arrangement include a first droplet group including a plurality of first droplet arrays, each of the plurality of first droplet arrays consisting of droplets arrayed at a first pitch in a first direction along a side of the predetermined region, the plurality of first droplet arrays being arranged at a second pitch in a second direction different from the first direction, a second droplet group including a plurality of second droplet arrays, each of the plurality of second droplet arrays consisting of droplets arrayed at the first pitch in the first direction, the plurality of second droplet arrays being arranged at the second pitch in the second direction, and a third droplet array consisting of droplets arrayed at the first pitch in the first direction, wherein the second droplet group is arranged while being shifted, with respect to the first droplet group, by a first distance in the first direction and by a second distance in the second direction, the first distance being smaller than the first pitch, and the second distance being half the second pitch, and wherein the third droplet array is arranged while being shifted, with respect to a specific droplet array which is the first droplet array closest to the side in the first droplet group, by the first distance in the first direction, and a distance between the specific droplet array and the third droplet array in the second direction is smaller than the second distance.

Further features of the present invention will become apparent from the following description of exemplary embodiments with reference to the attached drawings.

BRIEF DESCRIPTION OF THE DRAWINGS

FIGS. 3A and 3B are views each showing an arrangement example of the imprint material (the plurality of droplets) in the first embodiment;

DESCRIPTION OF THE EMBODIMENTS

Figure 1:
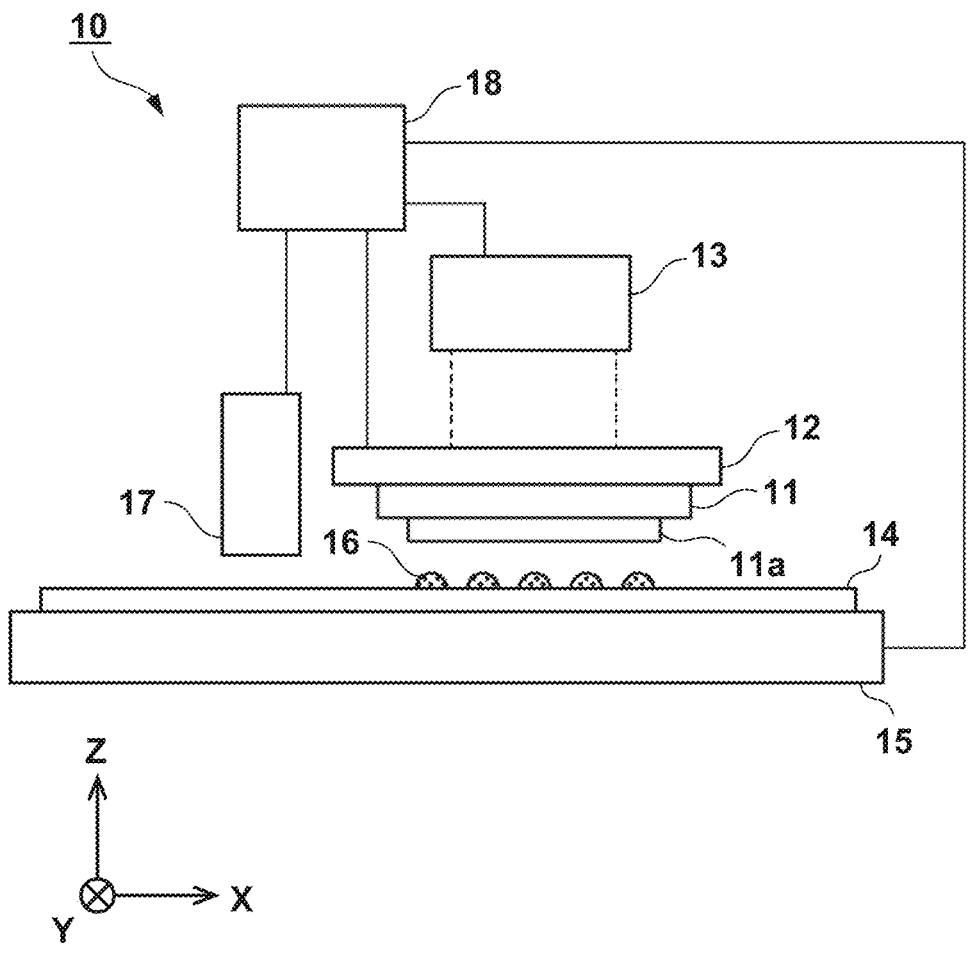
FIG. 1 is a schematic view showing an arrangement example of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

An imprint apparatus 10 according to the first embodiment of the present invention will be described. The imprint apparatus 10 is an apparatus that brings an imprint material supplied onto a substrate into contact with a mold and applying curing energy to the imprint material, thereby forming a pattern of a cured product to which a concave-convex pattern of a mold has been transferred. For example, the imprint apparatus 10 supplies a liquid imprint material as a plurality of droplets onto a substrate, and cures the imprint material in a state in which a mold on which a concave-convex pattern has been formed is in contact with the imprint material on the substrate. Then, the imprint apparatus increases the spacing between the mold and the substrate, thereby separating (releasing) the mold from the cured imprint material. Thus, the pattern of the mold can be transferred to the imprint material on the substrate. Such a series of processes is called an "imprint process", and is performed for each of a plurality of shot regions on the substrate.

As the imprint material, a curable composition (to be also referred to a resin in an uncured state) that is cured by receiving curing energy is used. As the curing energy, an electromagnetic wave, heat, or the like is used. The electromagnetic wave is light selected from the wavelength range of 10 nm (inclusive) to 1 mm (inclusive), for example, infrared light, a visible light beam, ultraviolet light, or the like.

The curable composition is a composition cured by light irradiation or heating. A photo-curable composition cured by light contains at least a polymerizable compound and a photopolymerization initiator, and may contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component.

The imprint material is applied in a film shape onto the substrate by a spin coater or a slit coater. Alternatively, the imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

FIG. 1 is a schematic view showing an arrangement example of the imprint apparatus 10 according to this embodiment. The imprint apparatus 10 according to this embodiment can include, for example, an imprint head 12 that holds a mold 11, a curing unit 13, a stage 15 that holds a substrate 14, a supplier 17, and a controller 18. The controller 18 is formed by, for example, a computer including a CPU and a memory, and performs an imprint process by controlling the respective units of the imprint apparatus 10. Note that the imprint apparatus 10 according to this embodiment employs a photo-curing method of curing an imprint material by irradiating the imprint material with light. Hereinafter, directions orthogonal to each other in a surface parallel to the surface of the substrate 14 are defined as the X-axis direction and the Y-axis direction, and a direction perpendicular to the X-axis direction and the Y-axis direction is defined as the Z-axis direction. In the following description, the "X-axis direction" can be defined to include the +X direction and the −X direction. This also applies to the "Y-axis direction" and the "Z-axis direction".

The mold 11 is usually formed from a material capable of transmitting ultraviolet light, such as quartz. In a partial region 11a (mesa region) protruding toward the substrate side in the surface on the substrate side, a concave-convex pattern to be transferred to an imprint material R on a substrate is formed. In the following description, the partial region 11a (mesa region) may be referred to as the pattern region 11a. As the substrate 14, glass, ceramic, a metal, a semiconductor, a resin, or the like is used. A member made of a material different from that of the substrate may be formed on the surface of the substrate, as needed. More specifically, the substrate 14 is a silicon wafer, a semiconductor compound wafer, silica glass, or the like. An adhesive layer may be provided before the application of an imprint material to improve the adhesiveness between the imprint material and the substrate, as needed.

The imprint head 12 holds (fixes) the mold 11 by a vacuum chuck force or an electrostatic force. The imprint head 12 includes a driving mechanism that drives (moves) the mold 11 in the Z-axis direction. The imprint head 12 has a function of pressing (bringing into contact) the mold 11 against an uncured imprint material 16 supplied onto the substrate, and a function of separating the mold 11 from the cured imprint material 16 on the substrate.

The stage 15 includes a substrate chuck that holds the substrate 14, and a driving mechanism for performing alignment between the mold 11 and the substrate 14. The driving mechanism is formed by, for example, a coarse driving system and a fine driving system, and drives (moves) the substrate 14 in the X-axis direction and the Y-axis direction. The driving mechanism may also have a function of driving the substrate 14 not only in the X-axis direction and the Y-axis direction but also in the Z-axis direction and θ direction (the rotation direction around the Z-axis), and a tilt function for correcting the tilt of the substrate 14.

The curing unit 13 (irradiation unit) cures the imprint material 16 by irradiating the imprint material 16 on the substrate with light (for example, ultraviolet light) via the mold 11 in a state in which the mold 11 and the imprint material 16 on the substrate are in contact with each other. In this embodiment, the curing unit 13 includes, for example, a halogen lamp, an LED, or the like, and irradiates the imprint material 16 on the substrate with ultraviolet light via the mold 11, thereby curing the imprint material 16.

The supplier 17 (discharge unit or dispenser) supplies the imprint material 16 (for example, an uncured resin) as a plurality of droplets onto the substrate 14. The supplier 17 includes a plurality of discharge holes (nozzles) which discharge droplets of the imprint material 16 onto the substrate 14, and discharges droplets of the imprint material 16 from the respective discharge holes while the substrate 14 and the supplier 17 are relatively moving. With this, the imprint material 16 can be supplied as the plurality of droplets onto the substrate.

For example, if the plurality of discharge holes are arrayed along the Y-axis direction, a step of supplying droplets of the imprint material 16 from the respective discharge holes onto the substrate is performed while the substrate is moved in a direction (for example, the X-axis direction) different from the array direction of the plurality of discharge holes. At this time, discharge (that is, the discharge timing) of the droplets from the respective discharge holes is controlled by the controller 18 based on the information (to be sometimes referred to as arrangement information hereinafter) indicating the target arrangement of the plurality of droplets of the imprint material 16 on the substrate (on the shot region). That is, the interval in the Y-axis direction between the plurality of droplets of the imprint material 16 supplied onto the substrate can be defined by the interval between the plurality of discharge holes provided in the supplier 17, and the interval in the X-axis direction can be defined by the discharge timing of the droplets from the respective discharge holes. Here, the arrangement information is generated in advance by the controller 18 and/or an external computer based on, for example, the design information of the concave-convex pattern formed in the pattern region 11a of the mold 11. The amount of one droplet of the imprint material 16 discharged from each discharge hole of the supplier 17 can range from sub-picoliter to several picoliters. One droplet of the imprint material 16 is supplied onto the substrate by one discharge operation from each discharge hole.

In the imprint apparatus 10, it is necessary to achieve both of improvement of the uniformity of the residual layer thickness and reduction of extrusion (protrusion) of the imprint material 16. The residual layer thickness is the thickness of the imprint material 16 between the substrate 14 and the concave portion of the concave-convex pattern of the imprint material 16 formed on the substrate 14 by the imprint process. If the residual layer thickness of the concave-convex pattern of the imprint material 16 formed on the substrate is nonuniform, for example, it can become difficult to accurately control the succeeding etching process which is performed using, as a mask, the concave-convex pattern of the imprint material 16. Extrusion of the imprint material 16 is extrusion of the imprint material 16 supplied onto a predetermined shot region (onto the shot region in this embodiment) of the substrate 14 from the predetermined region during the contact step (pressing step) between the imprint material 16 and the mold 11. If extrusion of the imprint material 16 occurs, for example, due to the influence of the extrusion, it can become difficult to accurately perform the imprint process on an adjacent shot region.

In a conventional method in which the plurality of droplets of the imprint material 16 are arranged in a houndstooth pattern so as to achieve the uniform residual layer thickness in a shot region, extrusion of the imprint material 16 occurs. In addition, conventionally, when a method of reducing the number of droplets of the imprint material 16 arranged in the outer peripheral portion of a shot region (predetermined region) to reduce extrusion of the imprint material 16 is employed, the residual layer thickness in the outer peripheral portion becomes smaller than that in other portions, so that the residual layer thickness can be nonuniform. Therefore, in this embodiment, the arrangement of the imprint material 16 (the plurality of droplets) that can achieve both of improvement of the uniformity of the residual layer thickness and reduction of extrusion of the imprint material 16 will be described.

Figure 2B:
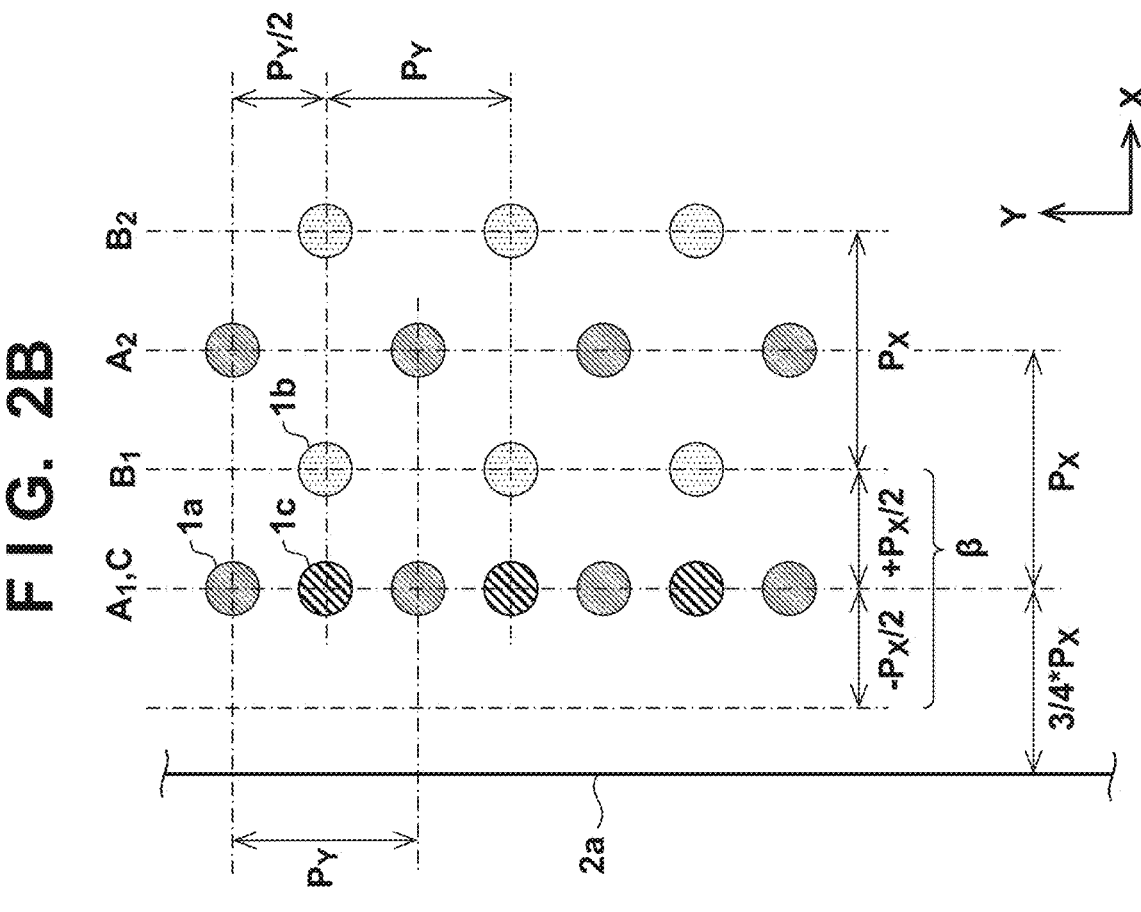
FIGS. 2A and 2B are views showing an arrangement example of an imprint material (the plurality of droplets) in the first embodiment.
Figure 2A:
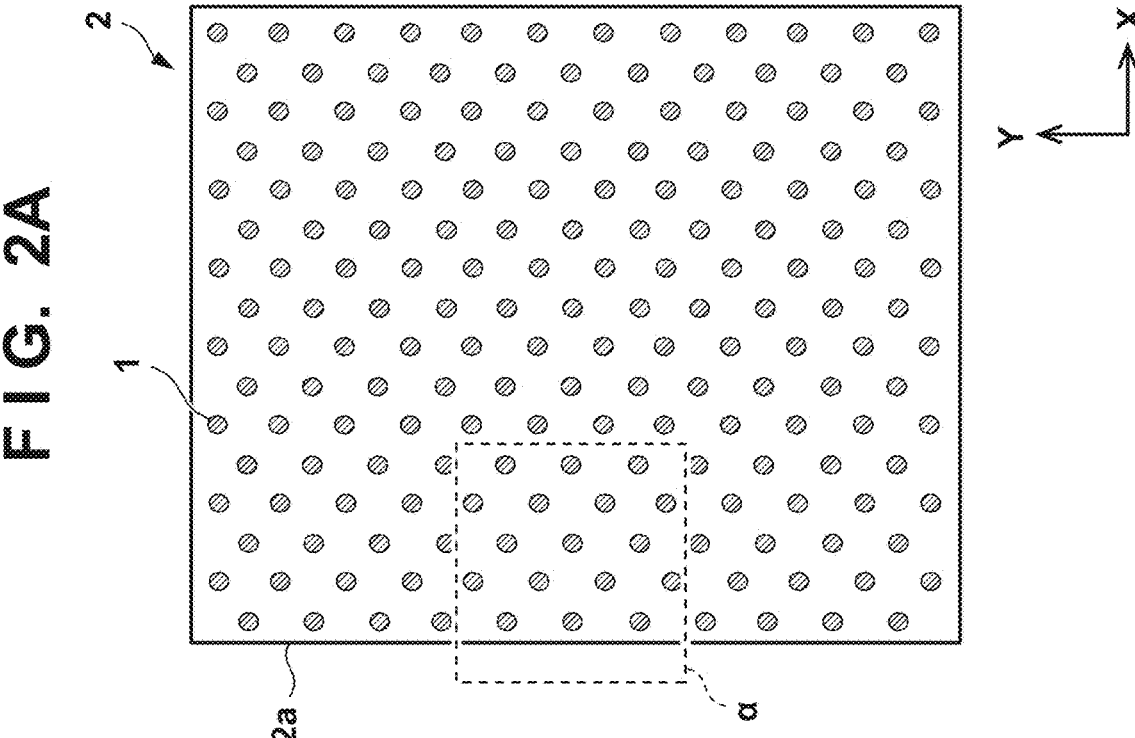

FIGS. 2A and 2B show an arrangement example of the imprint material 16 (the plurality of droplets 1) according to this embodiment. The arrangement example shown in FIGS. 2A and 2B may be understood as an example of the target arrangement of the plurality of droplets 1 of the imprint material 16 to be supplied to a shot region 2 (predetermined region). In the arrangement example of the imprint material 16 according to this embodiment, the plurality of droplets 1 of the imprint material 16 are arranged in a houndstooth pattern inside the shot region 2 and the arrangement of the droplets in the outer peripheral portion of the shot region 2 is changed (corrected or modified). FIG. 2A shows the arrangement example of the plurality of droplets 1 in the entire shot region 2, and FIG. 2B shows the arrangement example of the droplets 1 in the outer peripheral portion of the shot region 2 (an enlarged view of a partial region a in FIG. 2A). Note that in FIG. 2A, the change of the arrangement of the droplets 1 in the outer peripheral portion of the shot region 2 is not shown.

The plurality of droplets 1 in the arrangement example in this embodiment include a first droplet group including a plurality of first droplets 1a, and a second droplet group including a plurality of second droplets 1b. The plurality of first droplets 1a and the plurality of second droplets 1b are arranged in the houndstooth pattern.

The first droplet group includes a plurality of first droplet arrays, in each of which the first droplets 1a are arrayed at a first pitch $P_Y$ in the first direction (Y-axis direction) along a side 2a (outer periphery) of the shot region 2 (predetermined region), at a second pitch $P_x$ in the second direction (X-axis direction) different from the first direction. In FIG. 2B, first droplet arrays $A_1$ and $A_2$ alone are shown among the plurality of first droplet arrays. However, it may be understood that the first droplet array having the same arrangement as each of the first droplet arrays $A_1$ and $A_2$ is repeatedly arranged at the second pitch $P_x$ in the +X direction. Further, among the plurality of first droplet arrays, the first droplet array $A_1$ (to be sometimes referred to as a specific droplet array hereinafter) closest to the side 2a of the shot region 2 is arranged so as to be spaced apart from the side 2a by a predetermined distance. The predetermined distance can be set within the range of ½ to 1 times the second pitch $P_x$, and is preferably set to be ¾ the second pitch $P_x$.

On the other hand, the second droplet group includes a plurality of second droplet arrays, in each of which the second droplets 1b are arrayed at the first pitch $P_Y$ in the first direction (Y-axis direction), at the second pitch $P_x$ in the second direction (X-axis direction). In FIG. 2B, second droplet arrays $B_1$ and $B_2$ alone are shown among the plurality of second droplet arrays. However, it may be understood that the second droplet array having the same arrangement as each of the second droplet arrays $B_1$ and $B_2$ is repeatedly arranged at the second pitch $P_x$ in the +X direction. Further, the second droplet group (the second droplet arrays $B_1$ and $B_2$) is arranged while being shifted (offset), with respect to the first droplet group (the first droplet arrays $A_1$ and $A_2$), by a first distance in the first direction (Y-axis direction (−Y direction)) and by a second distance in the second direction (X-axis direction (+X direction)). The first distance is only required to be smaller than the first pitch $P_Y$. In this embodiment, the first distance is half ($P_Y/2$) the first pitch $P_Y$. The second distance is half ($P_x/2$) the second pitch $P_x$. When the first droplet group and the second droplet group are arranged as described above, the plurality of first droplets 1a and the plurality of second droplets 1b can be arranged in the houndstooth pattern.

The plurality of droplets 1 in the arrangement example in this embodiment further include a third droplet array C in which third droplets 1c are arrayed at the first pitch $P_Y$ in the first direction (Y-axis direction) as shown in FIG. 2B. The third droplet array C (third droplets 1c) is arranged at the same position as the second droplet arrays $B_1$ and $B_2$ (second droplets 1b) in the first direction (Y-axis direction), so that it may be understood as a part of the second droplet group described above. That is, the third droplet array C may be understood as the second droplet array, which is to be arranged in the outer peripheral portion to achieve the target thickness of the residual layer thickness in the outer peripheral portion of the shot region 2, shifted toward the inside (+X direction) of the shot region 2.

The third droplet array C is arranged while being shifted (offset), with respect to the first droplet array $A_1$ (specific droplet array) closest to the side 2a of the shot region 2 in the first droplet group (the plurality of first droplet arrays), by the first distance in the first direction (Y-axis direction). In this embodiment, the first distance is half ($P_y/2$) the first pitch $P_y$. In addition, the third droplet array C is arranged such that the distance between the first droplet array $A_1$ (specific droplet array) and the third droplet array C in the second direction (X-axis direction) is smaller than the second distance ($P_x/2$). That is, in the second direction (X-axis direction), the third droplet array C can be arranged within a range β, that is, with the position of the first droplet array $A_1$ as a reference (0), on the +X direction side of the position of $-P_x/2$ and on the −X direction side of the position of the $+P_x/2$. Further, the third droplet array C can be arranged so as to be spaced apart from the side 2a of the shot region 2 by a distance of at least ¼ the second pitch $P_x$.

Figures 3A, 3B:
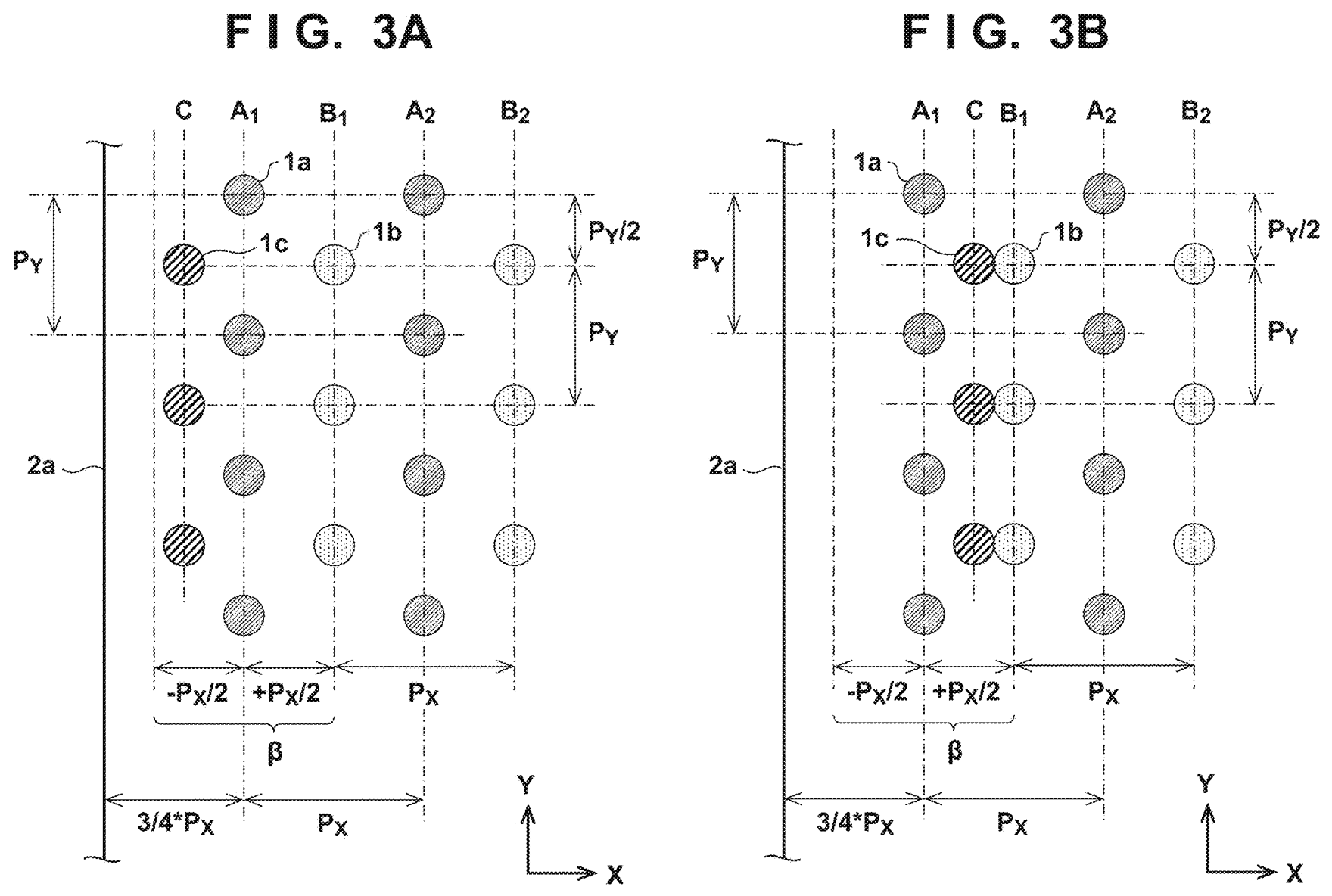

Here, in FIG. 2B, the third droplet array C is arranged at the same position as the first droplet array $A_1$ (specific droplet array) in the second direction (X-axis direction). However, as shown in FIG. 3A, the third droplet array C may be arranged at a position closer to the side 2a than the first droplet array $A_1$ in the second direction (X-axis direction). As has been described above, the third droplet array C corresponds to the second droplet array, which is to be arranged in the outer peripheral portion of the shot region 2, shifted toward the inside (+X direction) of the shot region 2. Accordingly, the amount of the imprint material (the amount of the droplets) for achieving the target thickness of the residual layer thickness in the outer peripheral portion of the shot region 2 is ensured. Then, in order to reduce extrusion of the imprint material from the shot region 2 (side 2a), with the position of the first droplet array $A_1$ in the second direction (X-axis direction) as the reference, the third droplet array C is arranged on the +X direction side of the position of $-P_x/2$.

Alternatively, as shown in FIG. 3B, the third droplet array C may be arranged at a position farther from the side 2a than the first droplet array $A_1$ in the second direction (X-axis direction). In this case, extrusion of the imprint material from the shot region 2 (side 2a) can be further reduced, but the time required for the imprint material to reach the side 2a increases, so that the productivity (throughput) can decrease. Therefore, in consideration of achievement of both reduction of extrusion and the productivity, the third droplet array C is arranged on the −X direction side of the position of $+P_x/2$ with the position of the first droplet array $A_1$ in the second direction (X-axis direction) as the reference.

Figure 4:
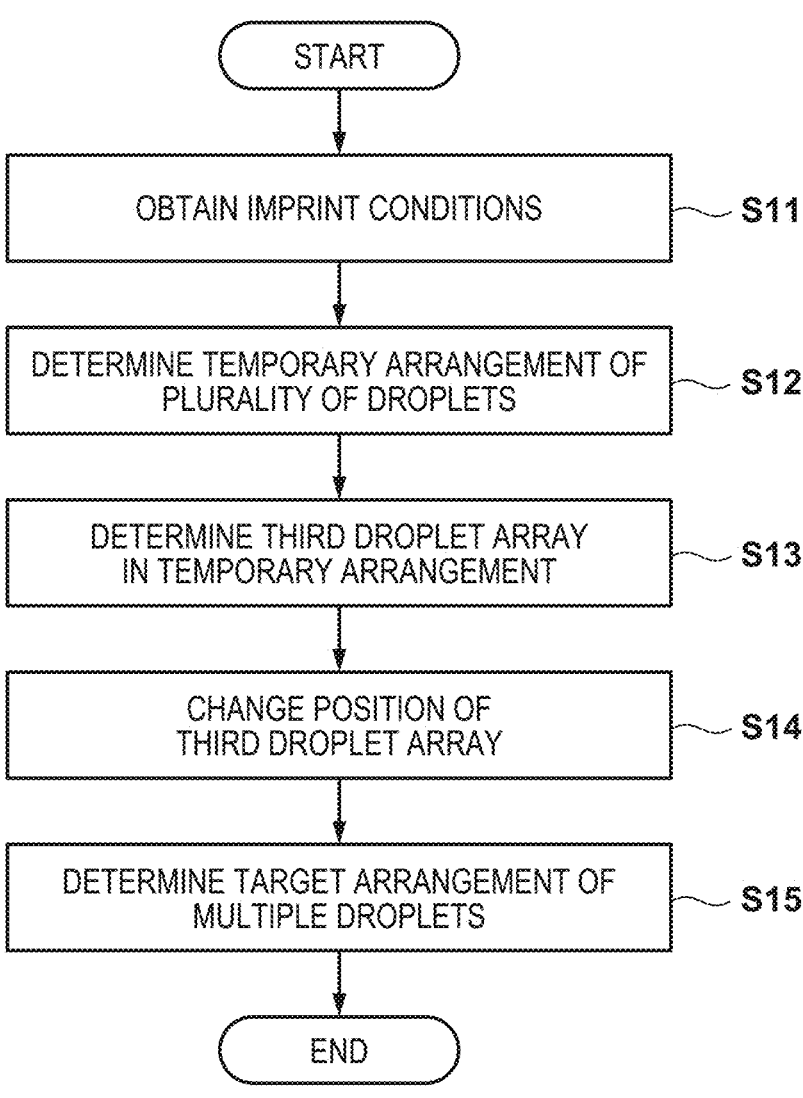
FIG. 4 is a flowchart illustrating a determination method of determining a target arrangement of the imprint material (the plurality of droplets)

Next, a determination method of determining the target arrangement of the plurality of droplets 1 of the imprint material 16 to be supplied onto the shot region 2 (predetermined region) in the imprint process will be described. FIG. 4 is a flowchart illustrating the determination method of determining the target arrangement of the imprint material 16 (the plurality of droplets 1). An example will be described below in which the flowchart (determination method) of FIG. 4 is performed by the controller 18 of the imprint apparatus 10. However, the flowchart may be performed by an external computer outside the imprint apparatus 10.

In step S11, the controller 18 obtains various kinds of conditions (imprint conditions) in the imprint process. Examples of the imprint conditions are the arrangement of the concave-convex pattern formed in the pattern region 11a of the mold 11, the depth of the concave pattern in the concave-convex pattern, the thickness of the residual layer thickness of the pattern of the imprint material 16 to be formed on the shot region 2 of the substrate 14, and the like. Next, in step S12, the controller 18 determines, based on the imprint conditions obtained in step S11, the temporary arrangement of the plurality of droplets 1 to be arranged on the shot region 2. For example, the controller 18 determines the first pitch $P_y$ and the second pitch $P_x$ described above based on the imprint conditions while assuming (setting) that the plurality of droplets 1 are arranged in a houndstooth pattern on the shot region 2. With this, the temporary arrangement can be determined.

In step S13, the controller 18 determines, as the third droplet array C, the droplet array closest to the side 2a of the shot region 2 in the temporary arrangement determined in step S12. Then, in step S14, the controller 18 changes the position of the third droplet array C within the range β described above. For example, the controller 18 can determine the position of the third droplet array C in accordance with whether reduction of extrusion of the imprint material is prioritized or the productivity is prioritized. As an example, if the productivity is given a higher priority than reduction of extrusion of the imprint material, as shown in FIG. 3A, the controller 18 can arrange the third droplet array C closer to the side 2a of the shot region 2 than the first droplet array $A_1$ (specific droplet array) in accordance with the priority (as the priority is higher). On the other hand, if reduction of extrusion of the imprint material is given a higher priority than the productivity, as shown in FIG. 3B, the controller 18 can arrange the third droplet array C farther from the side 2a of the shot region 2 than the first droplet array $A_1$ in accordance with the priority (as the priority is higher).

In step S15, the controller 18 determines, as the target arrangement, the arrangement of the plurality of droplets 1 obtained by changing the position of the third droplet array C in step S14. With this, as has been described above, the arrangement including the first droplet group including the plurality of first droplet arrays (the plurality of first droplets 1a), the second droplet group including the plurality of second droplet arrays (the plurality of second droplets 1b), and the third droplet array C (the plurality of third droplets 1c) can be determined as the target arrangement.

As has been described above, according to this embodiment, it is possible to obtain the target arrangement of the imprint material 16 (the plurality of droplets) that can achieve both of improvement of the uniformity of the residual layer thickness and reduction of extrusion of the imprint material 16. The imprint apparatus 10 can achieve both of improvement of the uniformity of the residual layer thickness and reduction of extrusion of the imprint material 16 by supplying the imprint material 16 onto the shot region 2 in accordance with the target arrangement in the imprint process on the shot region 2. That is, it is possible to accurately form the pattern of the imprint material on the substrate 14 (on the shot region 2).

Second Embodiment

The second embodiment according to the present invention will be described. In the first embodiment described above, the shot region 2 of the substrate 14 is set as the predetermined region onto which the imprint material 16 is to be supplied as the plurality of droplets 1. However, the present invention is not limited to this, and a partial region included in the shot region 2 may be set as the predetermined region. Note that this embodiment basically takes over the first embodiment, and the arrangement and processing other than those described below are as described in the first embodiment.

Figures 5A, 5B:
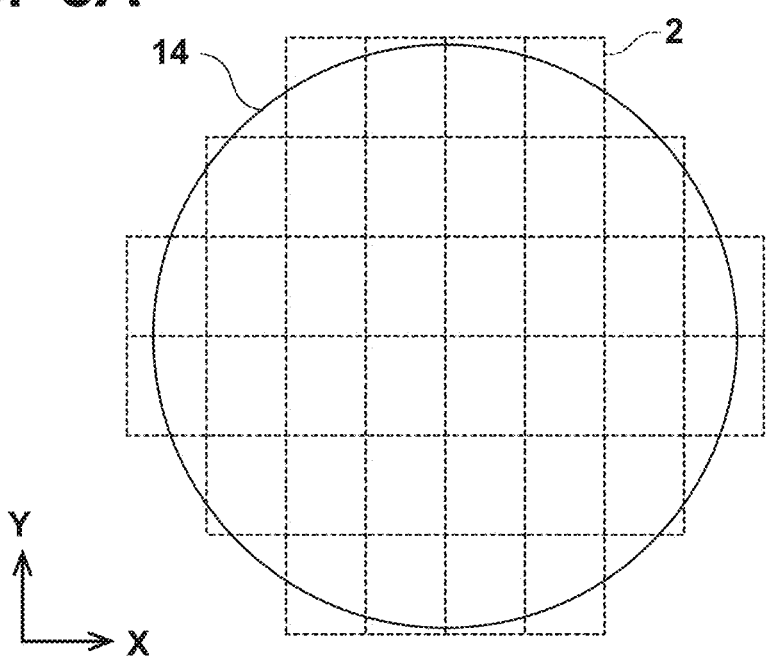
FIGS. 5A and 5B are views showing an arrangement example of an imprint material (the plurality of droplets) in the second embodiment.

FIG. 5A shows the layout of a plurality of shot regions 2 in a substrate 14, and FIG. 5B shows the target arrangement of an imprint material 16 to be supplied as the plurality of droplets 1 onto each shot region. A pattern region 11a of a mold 11 is formed with a pattern including, for example, lines and spaces, holes, pillars, and other depths, and the arrangement (tendency) of the pattern may be different for each partial region in the pattern region 11a. In this case, the target arrangement of the imprint material 16 can be changed for each partial region. In the example shown in FIG. 5B, the pattern arrangement in a partial region 8 is different from that in the remaining region and, accordingly, the target arrangement of the imprint material 16 in the partial region 8 is also different from that in the remaining region. In this case, in the boundary portion including the boundary (that is, a side of the partial region 8) between the partial region 8 and the remaining region, the decrease of the uniformity of the residual layer thickness and/or extrusion of the imprint material readily occurs. Therefore, also for the target arrangement of the imprint material in the partial region 8, the position of a third droplet array C is changed (corrected or modified) as has been described in the first embodiment. In this embodiment, the side (the boundary with the remaining region) of the partial region 8 can correspond to the side of the shot region 2 in the first embodiment.

As has been described above, in this embodiment, the method described in the first embodiment is applied to not only the outer peripheral portion of the shot region 2 but also to the boundary portion of the partial region 8 inside the shot region 2. With this, also in the boundary portion (side) of the partial portion 8, it is possible to achieve both of improvement of the uniformity of the residual layer thickness and reduction of extrusion of the imprint material. Accordingly, in the entire region of the shot region 2, it is possible to accurately form the pattern of the imprint material.

<Embodiment of Method of Manufacturing Article>

A method of manufacturing an article according to the embodiment of the present invention is suitable for manufacturing an article, for example, a microdevice such as a semiconductor device or an element having a microstructure. The method of manufacturing an article according to the embodiment includes a step of forming a pattern to an imprint material supplied (applied) onto a substrate by using the above-described imprint apparatus (imprint method) and a step of processing the substrate on which the pattern has been formed in the preceding step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is superior to a conventional method in at least one of the performance, quality, productivity, and production cost of the article.

The pattern of a cured material formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile or nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured material is directly used as the constituent member of at least some of the above-described articles or used temporarily as a resist mask. After etching or ion implantation is performed in the substrate processing step, the resist mask is removed.

Figure 6A:
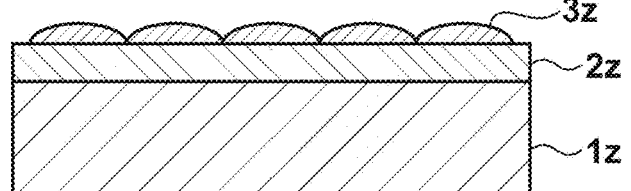
FIGS. 6A to 6F are views for explaining a method of manufacturing an article.

A detailed method of manufacturing an article will be described next. As shown in FIG. 6A, a substrate 1z such as a silicon wafer with a target material 2z to be processed such as an insulator formed on the surface is prepared. Next, an imprint material 3z is applied to the surface of the target material 2z by an inkjet method or the like. A state in which the imprint material 3z is applied as a plurality of droplets onto the substrate is shown here.

Figure 6B:
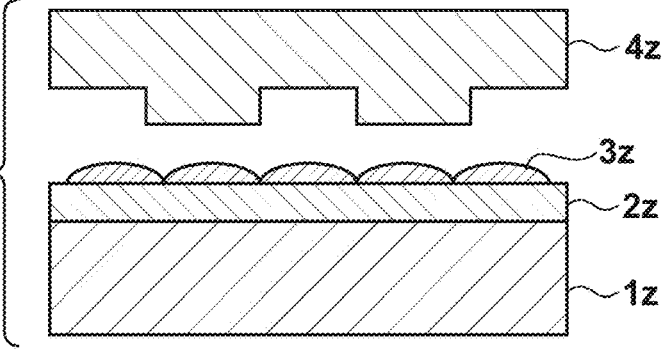
Figure 6C:
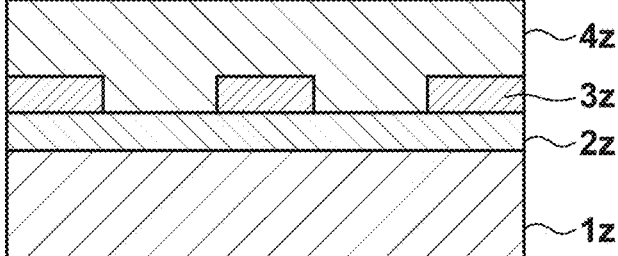

As shown in FIG. 6B, a mold 4z for imprint is caused to face to the substrate 1z such that a pattern with convex and concave portions formed in the mold 4z is directed to the imprint material 3z on the substrate 1z. As shown in FIG. 6C, the mold 4z and the imprint material 3z applied on the substrate 1z are brought into contact with each other, and subjected to a pressure. The gap between the mold 4z and the target material 2z is filled with the imprint material 3z. In this state, by irradiating the imprint material 3z with energy for curing through the mold 4z, the imprint material 3z is cured.

Figure 6D:
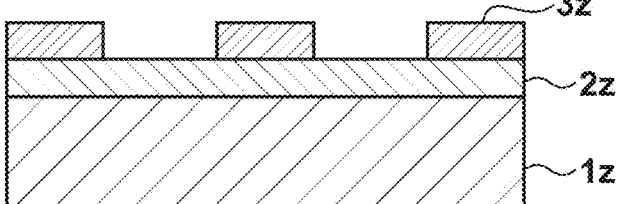

As shown in FIG. 6D, after the imprint material 3z is cured, the mold 4z is separated from the substrate 1z. Then, the pattern of the cured material of the imprint material 3z is formed on the substrate 1z. In the pattern of the cured material, the concave portion of the mold corresponds to the convex portion of the cured material, and the convex portion of the mold corresponds to the concave portion of the cured material. That is, the pattern with convex and concave portions in the mold 4z is transferred to the imprint material 3z.

Figure 6E:
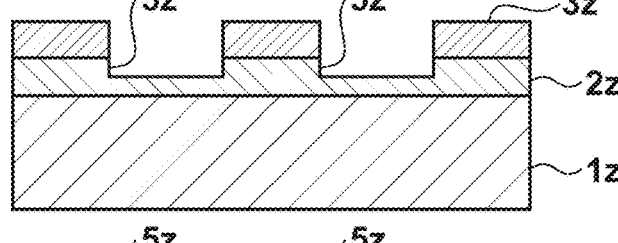
Figure 6F:
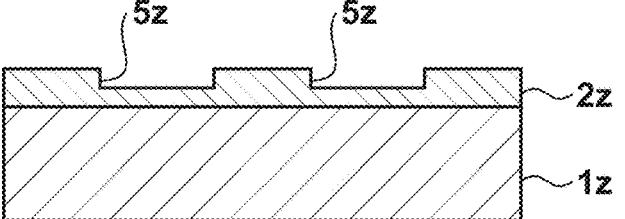

As shown in FIG. 6E, by performing etching process using the pattern of the cured material as an etching resistant mask, a portion of the surface of the target material 2z where the cured material does not exist or remains thin is removed to form a groove 5z. As shown in FIG. 6F, by removing the pattern of the cured material, an article with the grooves 5z formed in the surface of the target material 2z can be obtained. Here, the pattern of the cured material is removed. However, instead of processing or removing the pattern of the cured material, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-066065 filed on Apr. 8, 2021, which is hereby incorporated by reference herein in its entirety.

What is claimed is:

1. An imprinting method comprising:

determining, in order to form an imprint material with a pattern on a substrate using a mold, a target arrangement of the imprint material to be supplied as a plurality of droplets onto a predetermined region of the substrate, the plurality of droplets include a first droplet group including a plurality of first droplet arrays, a second droplet group including a plurality of second droplet arrays, and a single third droplet array; and supplying the imprint material onto the substrate based on information indicating the target arrangement of the imprint material to be supplied as the plurality of droplets onto a predetermined region of the substrate, wherein in the first droplet group, each of the plurality of first droplet arrays consists of droplets arrayed at a first pitch in a first direction along a side of the predetermined region, and the plurality of first droplet arrays are arranged at a second pitch in a second direction different from the first direction, wherein in the second droplet group, each of the plurality of second droplet arrays consists of droplets arrayed at the first pitch in the first direction, and the plurality of second droplet arrays are arranged at the second pitch in the second direction, wherein the third droplet array consists of a plurality of droplets arrayed at the first pitch in the first direction, wherein the second droplet group is arranged while being shifted, with respect to the first droplet group, by a first distance in the first direction and by a second distance in the second direction, the first distance being smaller than the first pitch, and the second distance being half the second pitch, and wherein the third droplet array is arranged while being shifted, with respect to a specific droplet array which is the first droplet array of the first droplet group closest to the side of the predetermined region, by the first distance in the first direction, and a distance between the specific droplet array and the third droplet array in the second direction is smaller than the second distance.

2. The method according to claim 1, wherein the third droplet array is arranged at a same position as the specific droplet array in the second direction.

3. The method according to claim 1, wherein the third droplet array is arranged at a position closer to the side than the specific droplet array in the second direction.

4. The method according to claim 1, wherein the third droplet array is arranged at a position farther from the side than the specific droplet array in the second direction.

5. The method according to claim 1, wherein the specific droplet array is arranged so as to be spaced apart from the side by a predetermined distance in the second direction, and the predetermined distance is within a range of ½ to 1 times the second pitch.

6. The method according to claim 5, wherein the third droplet array is arranged so as to be spaced apart from the side by a distance of at least ¼ the second pitch.

7. The method according to claim 1, wherein the specific droplet array is arranged so as to be spaced apart from the side by a distance of ¾ the second pitch.

8. The method according to claim 7, wherein the third droplet array is arranged so as to be spaced apart from the side by a distance of at least ¼ the second pitch.

9. The method according to claim 1, wherein the first distance is half the first pitch.

10. The method according to claim 1, wherein the second direction is a direction perpendicular to the first direction.

* * * * *